US 6,638,861 B1

(12) United States Patent
Ngo et al.

(10) Patent No.: US 6,638,861 B1
(45) Date of Patent: Oct. 28, 2003

(54) METHOD OF ELIMINATING VOIDS IN W PLUGS

(75) Inventors: Minh Van Ngo, Fremont, CA (US); Eric Paton, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 1 day.

(21) Appl. No.: 09/986,263

(22) Filed: Nov. 8, 2001

(51) Int. Cl.[7] .............................................. H01L 21/44
(52) U.S. Cl. ...................... 438/685; 438/683; 438/675; 438/672; 438/648; 438/637; 438/629
(58) Field of Search ................... 438/630, 685, 438/683, 675, 672, 628–629, 637–640, 643–645, 648

(56) References Cited

U.S. PATENT DOCUMENTS 5,780,908 A * 7/1998 Sekiguchi et al. .......... 257/383
6,027,990 A * 2/2000 Thakur et al. .............. 438/533
6,143,650 A 11/2000 Pramanick et al.
6,261,963 B1 7/2001 Zhao et al.
6,399,486 B1 6/2002 Chen et al.

FOREIGN PATENT DOCUMENTS

| EP | 1 069 213 A2 | | 1/2001 | |
|----|---|---|---|---|
| JP | 61166143 | * | 7/1986 | ........... H01L/21/88 |
| JP | 41118638 | * | 7/1999 | ......... H01L/21/768 |

* cited by examiner

*Primary Examiner*—Carl Whitehead, Jr.
*Assistant Examiner*—Thanh Nguyen

(57) ABSTRACT

Reliable contacts/vias are formed by filling an opening in a dielectric layer with W and laser thermal annealing to eliminate or significantly reduce voids. Embodiments include depositing W to fill a contact/via opening in an interlayer dielectric, laser thermal annealing in $N_2$ to elevate the temperature of the W filling the contact/via opening and reflow the W thereby eliminating voids. Embodiments include conducting CMP either before or subsequent to laser thermal annealing.

16 Claims, 8 Drawing Sheets

METHOD OF ELIMINATING VOIDS IN W PLUGS

FIELD OF THE INVENTION

The present invention relates to a method of manufacturing semiconductor devices with accurately formed sub-micron features. The present invention has particular applicability in manufacturing high density, multi-level flash-memory semiconductor devices with reliable, low resistance contacts/vias.

BACKGROUND ART

As integrated circuit geometries continue to plunge into the deep sub-micron regime, it becomes increasingly more difficult to accurately form discreet semiconductor devices exhibiting the requisite reliability and circuit speed. Implementation becomes particularly problematic in manufacturing flash memory devices having a design rule less than about 0.15 micron and under, e.g., less than about 0.12 micron and under.

Conventional semiconductor devices comprise a semiconductor substrate in which various elements are formed, such as transistors, and a plurality of overlying sequentially formed interlayer dielectrics and conductive patterns in which an interconnect system is formed comprising conductive lines. Typically, conductive patterns on different levels, i.e., upper and lower levels, are electrically connected by a conductive plug filling a via hole, while a conductive plug filling a contact hole establishes electrical contact with an active region on a semiconductor substrate, such as a source/drain region. A conductive plug filling a via hole is typically formed by depositing an interlayer dielectric (ILD) on a conductive level comprising at least one conductive feature, forming an opening through the ILD by conventional photolithographic and etching techniques and filling the opening with a conductive material. Excess conductive material or the overburden on the surface of the ILD is typically removed by chemical-mechanical polishing (CMP). One such method is known damascene and basically involves forming an opening in the ILD and filling the opening with a metal. Dual damascene techniques involve forming an opening comprising a lower contact hole or via hole section in communication with an upper trench section, which opening is filled with a conductive material, typically a metal, to simultaneously form a conductive plug in electrical contact with an upper conductive line.

As geometries proceed into the deep sub-micron regime, the formation of reliable, low resistance contacts and interconnects becomes particularly problematic. For example, as contact/via openings are reduced in diameter and the aspect ratio (depth/diameter) increased, as to about 4:1 and higher, the openings become more vulnerable to defects, such as seams and coring in the form of porosity or voids running through the central portion of the contact or via. Such voids result in high and unstable contact resistance distribution, generate defects and decrease electromigration resistance in both flash memory devices and microprocessors.

Accordingly, there exists a need for methodology enabling the manufacture of semiconductor devices with improved reliability, including semiconductor devices containing MOS transistors as well as flash memory devices, such as electrically erasable programmable read only memory (EEPROM) devices. There exists a particular need for methodology enabling the manufacture of semiconductor devices having features in the deep sub-micron range and containing reliable and low resistance contacts and vias with improved electromigration performance.

DISCLOSURE OF THE INVENTION

An advantage of the present invention is a method of manufacturing a semiconductor device having features in the deep sub-micron regime with highly reliability vias and contacts exhibiting low and stable contact resistance distribution and improved electromigration performance.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer; depositing tungsten (W) to fill the opening; and laser thermal annealing the W in the opening.

Embodiments of the present invention comprise forming an opening in an oxide dielectric layer, such as a boron-phosphorus-doped silicated glass (BPSG) or a composite oxide layer comprising a BPSG layer with a silicon oxide layer derived from tetraethyl orthosilicate (TEOS) thereon, depositing an initial barrier layer of titanium (Ti) and then depositing at least one layer, e.g., three layers, of titanium nitride on the titanium layer. The opening is then filled with W. In an embodiment of the present invention, laser thermal annealing is conducted by impinging a laser light beam on the deposited W directed at the filled opening, typically at a radiant fluence of about 0.78 to about 1.10 joules/cm$^2$, for a brief period of time, e.g., about 10 to about 100 nanoseconds, in nitrogen ($N_2$), to elevate the temperature of the W in the opening thereby melting and reflowing the W in the filled opening, e.g., at a temperature of about 3,000° C. to about 3,600° C. Chemical mechanical polishing (CMP) is then conducted. In another embodiment of the present invention, CMP is conducted prior to laser thermal annealing.

Additional advantages of the present invention will become readily apparent to those skilled in the art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 2 through 8, similar elements or features are denoted by like reference characters.

DESCRIPTION OF THE INVENTION

Figure 1:
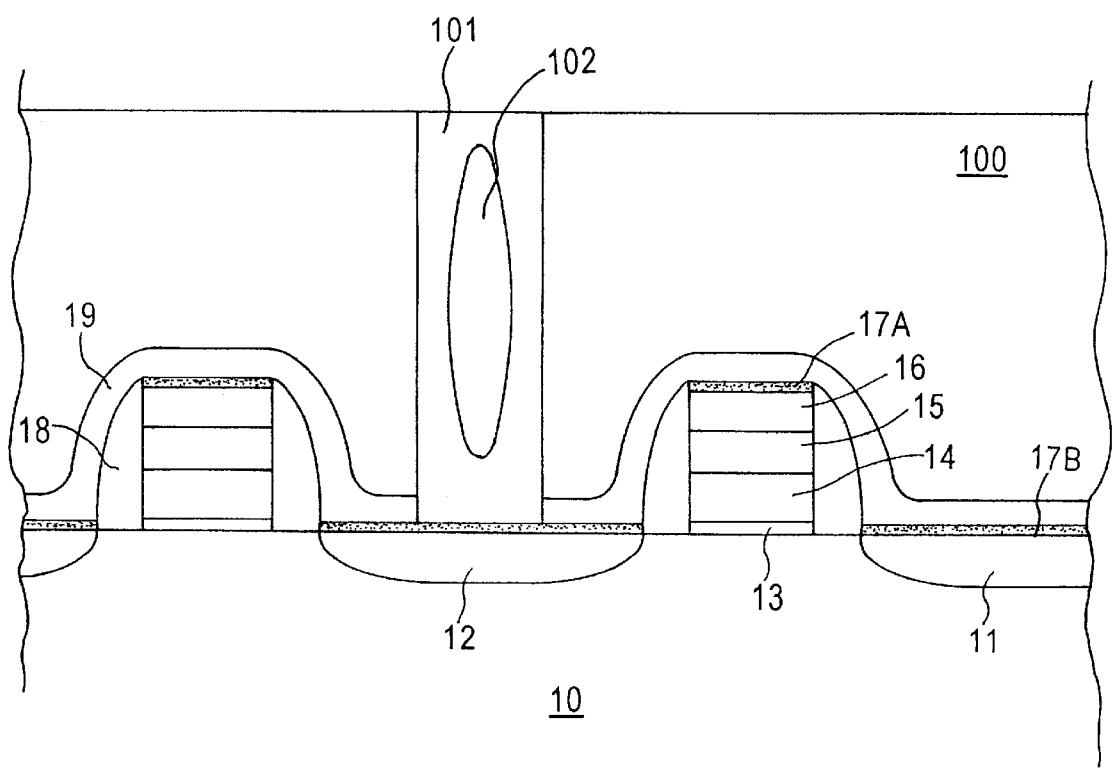
FIG. 1 schematically illustrates a W plug void problem addressed and solved by the present invention.

The present invention addresses and solves W contact/via reliability problems stemming from the undesirable formation of holes, with attendant high and unstable contact resistance distribution and poor electromigration performance, particularly as device geometries are reduced into the deep sub-micron regime. For example, as the width of a contact/via opening is reduced to about 0.225 to about 0.257 microns, e.g., about 0.25 microns, and the depth of the contact/via opening is extended to about 0.81 to about 0.99 micron, e.g., about 0.90 micron, or greater, and aspect ratios approach 4:1 and greater, it becomes extremely difficult to fill the contact/via openings without generating voids. The present invention addresses and solves that problem by proceeding in a conventional manner to fill the contact/via openings having high aspect ratios in a conventional manner to form a W plug having voids. The present invention departs from conventional practices by providing efficient methodology enabling the removal of the voids formed upon filling a contact/via opening having a high aspect ratio, thereby reducing contact resistance, providing a tighter resistance distribution and improving electromigration performance.

In accordance with embodiments of the present invention, a contact/via opening is formed in a dielectric layer, such as an oxide layer, e.g., BPSG or silicon oxide derived from TEOS. A barrier layer composite is then formed lining the opening. In accordance with embodiments of the invention, an initial thin Ti layer is deposited to line the opening and a titanium nitride layer is deposited on the initial Ti layer. W is then deposited in a conventional manner forming an overburden. At this point the W filling the contact/via opening contains undesirable voids or pores adversely impacting device performance, including electromigration performance.

In accordance with embodiments of the present invention, the W filling the opening is subjected to laser thermal annealing by impinging a pulsed laser light beam directed toward the W in the opening, as at a radiant fluence of about 0.78 to about 1.10 joules/cm$^2$, while flowing N$_2$ as at a flow rate of about 200 to about 2,000 sccm. During laser thermal annealing, W in the opening is elevated to a temperature of about 3,000° C. to about 3,600° C. causing melting and reflowing, thereby eliminating the voids. Subsequently, CMP can be inducted in a conventional manner such that the upper surface of the W filling the opening is substantially co-planar with the upper surface of the dielectric layer. In another embodiment, CMP is conducted prior to laser thermal annealing.

The use of laser thermal annealing in accordance with embodiments of the present invention to reduce interconnect voiding and to decrease contact resistance offers several advantages. For example, laser thermal annealing enables pinpoint accuracy in targeting the W filling the opening, thereby avoiding unnecessarily elevating the temperature of other portions of the wafer causing various problems, such as undue impurity diffusion.

In implementing embodiments of the present invention, any of various commercially available laser tools may be employed, such as those utilizing a laser source capable of operating at energies of about 10 to about 2,000 mJ/cm$^2$/pulse, e.g., about 100 to about 400 mJ/cm$^2$/pulse. Commercially available tools exist which can perform such laser annealing, either with or without mask. The Verdant Technologies laser anneal tool is but an example and operates at an exposure wavelength of 308 nm.

A W plug voiding problem addressed by the present invention is illustrated in FIG. 1 wherein transistors are formed on substrate 10. The transistors can comprise MOS transistors and/or dual gate memory cell transistors comprising floating and control gates with an interpoly (ONO) dielectric layer therebetween. For example, the transistors can comprise a tunnel oxide 13, a floating gate electrode 14, an ONO stack interpoly dielectric 15, and a control gate 16. A layer of metal silicide 17A, is formed on the upper surface of the gate electrode stack, while a layer of metal silicide 17B is formed on the source/drain regions 11, 12. A dielectric sidewall spacer 18, such as silicon oxide, silicon oxynitride or silicon nitride, is formed on the side surfaces of the gate electrode, and a silicon nitride etch stop layer 19 is typically deposited thereon. A dielectric layer 100, such as BPSG, or a composite of BPSG and silicon oxide derived from TEOS thereon, is deposited, as at a thickness of about 7,500 Å to about 8,500 Å, e.g., about 8,000 Å.

Conventional photolithographic and etching techniques are then implemented to form a contact opening in dielectric layer 100 exposing source/drain region 12. W is then deposited to fill the contact opening forming an overburden and CMP is then conducted leaving W plug 101 having an undesirable degree of porosity 102. The present invention effectively solves this particular problem in an efficient manner, thereby significantly reducing or eliminating such voids with an attendant improvement in electromigration performance and device reliability.

An embodiment of the present invention is schematically illustrated in FIGS. 2 through 5.

Figure 2:
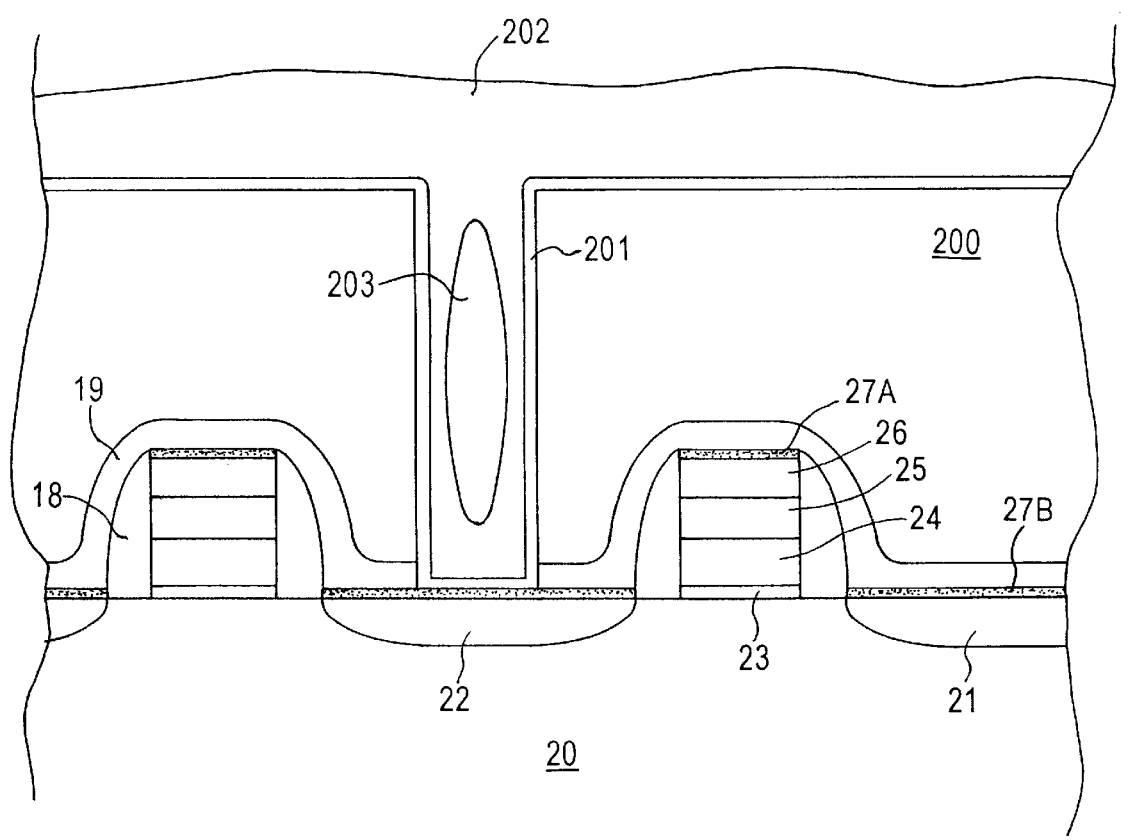
FIGS. 2 through 5 schematically illustrate sequential phases of a method in accordance with an embodiment of the present invention.

Adverting to FIG. 2, transistors are formed on substrate 20. The transistor can comprise MOS transistors and/or dual gate memory cell transistors comprising floating and control gates with an interpoly (ONO) dielectric layer therebetween. For example, the transistor can comprise a tunnel oxide 23, a floating gate. electrode 24, and ONO stack interpoly dielectric 25 and a control gate 26. A layer of metal silicide 27A, e.g., nickel silicide, is formed on the upper surface of the gate electrode stack, while a layer metal silicide 27B, e.g., nickel silicide, is formed on the source/drain regions 21, 22. A dielectric sidewall spacer 28, such as silicon oxide, silicon oxynitride or silicon nitride, is formed on the side surfaces of the gate electrode, and a silicon nitride etch stop layer 29 is typically deposited thereon. A dielectric layer 200, such as BPSG, or a composite of BPSG and silicon oxide derived from TEOS thereon, is deposited, as at a thickness of about 7,500 Å to about 8,500 Å, e.g., about 8,000 Å.

Conventional photolithographic and etching techniques are then implemented to form a contact opening in dielectric layer 200 exposing source/drain region 22. The contact opening typically has an aspect ratio (depth/diameter) of about 4:1 or greater.

A composite barrier layer 201 is then deposited to line the opening, such as an initial layer of Ti and a layer of titanium nitride thereon. W is then deposited to fill the opening and form an overburden 202. Due to the high aspect ratio of the contact opening, significant voiding 203 is generated in the W plug.

Figure 3:
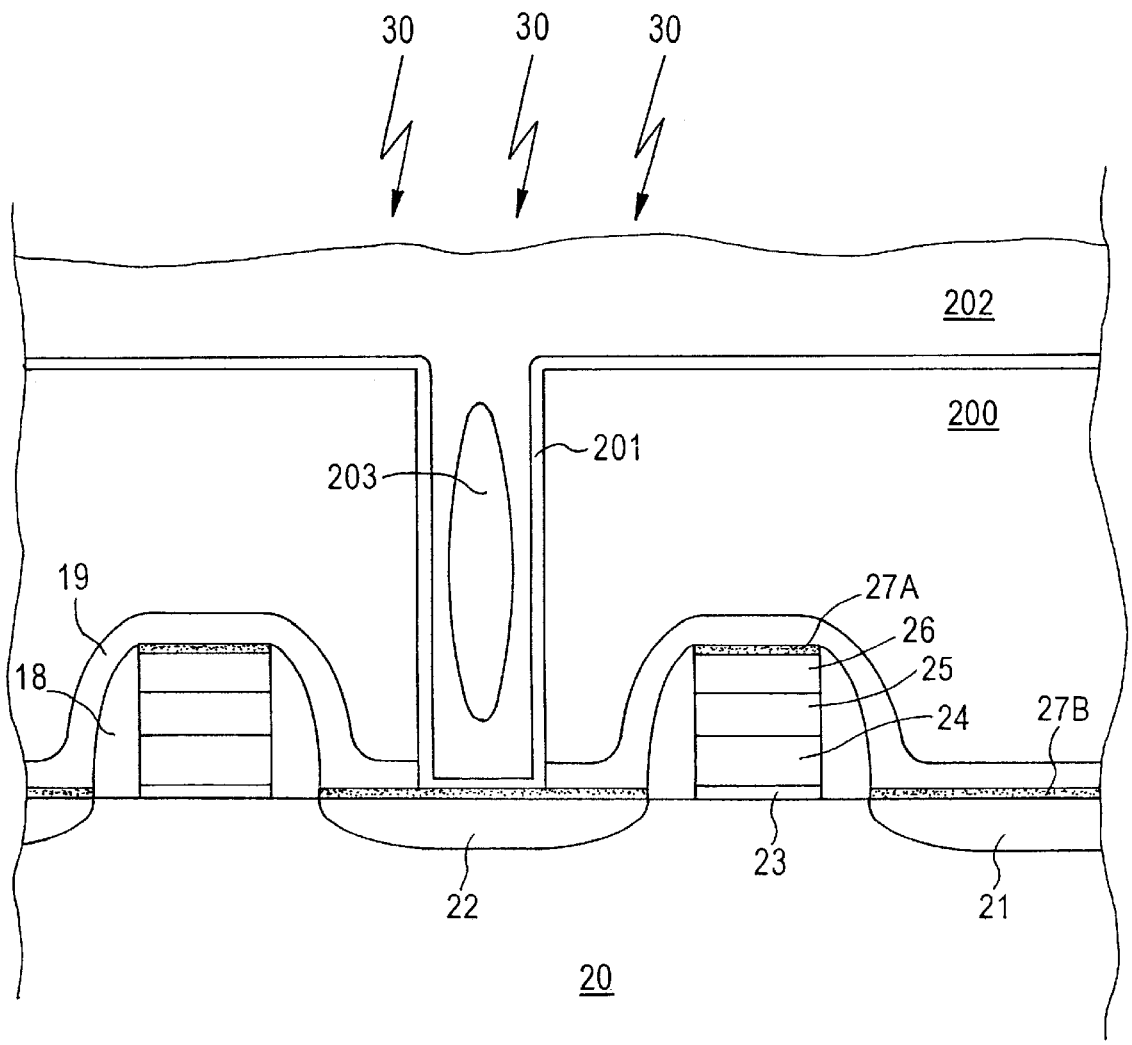
Figure 4:
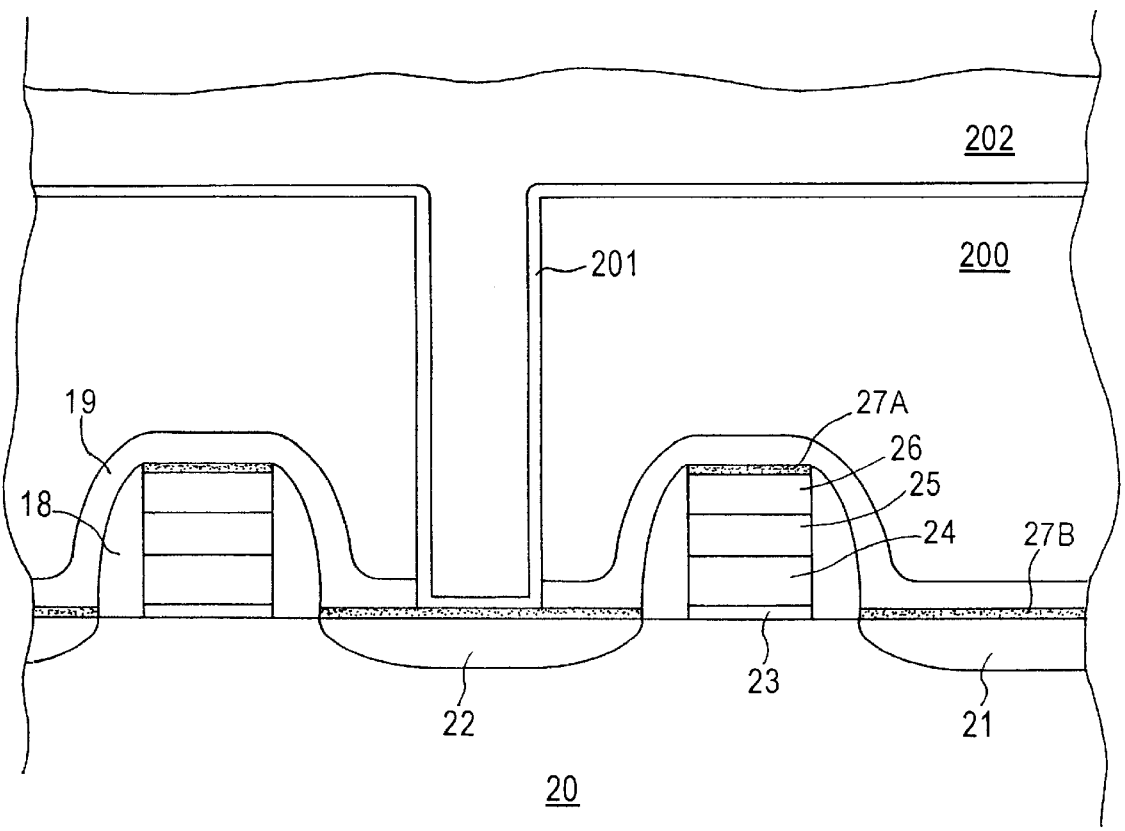
Figure 5:
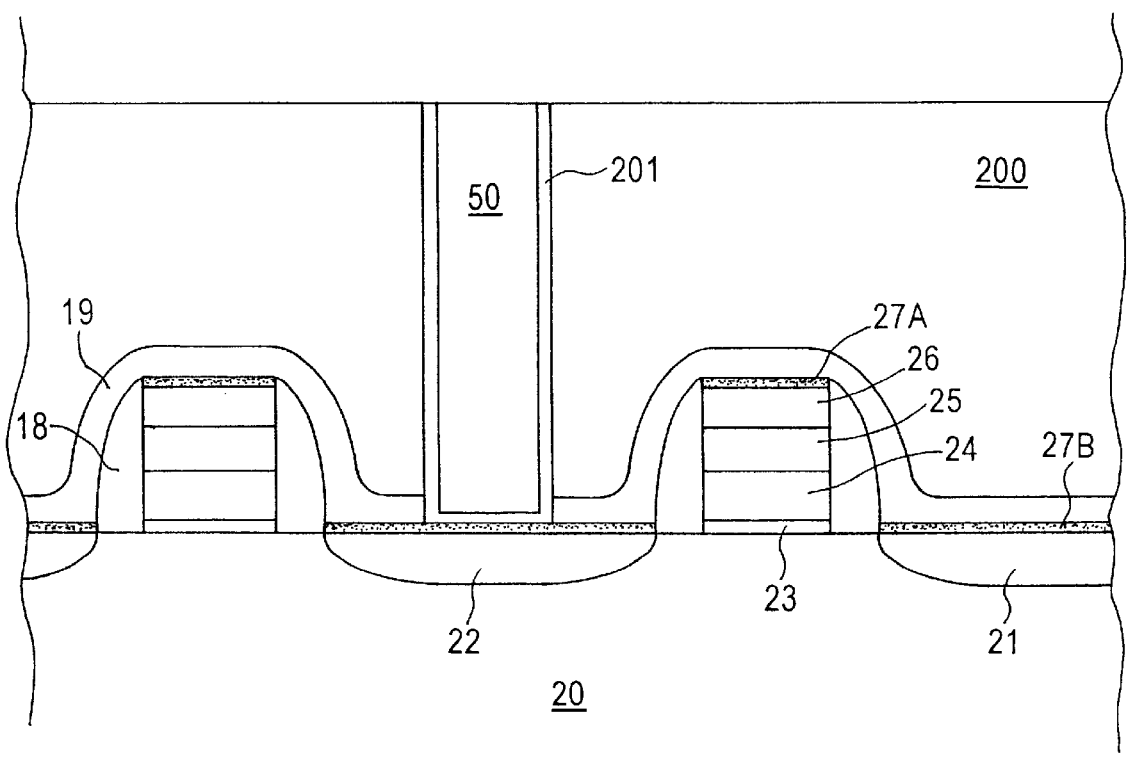

In accordance with an embodiment of the present invention, as illustrated in FIG. 3, laser thermal annealing is conducted by impinging a pulsed laser light beam on the deposited W directed toward the filled contact, as schematically illustrated by arrows 30, typically at a radiant fluence of about 0.78 to about 1.10 joules/cm$^2$, for a period of time of about 10 to about 100 nanoseconds, thereby elevating at a temperature of W in the plug to about 3,000° C. to about 3,600° C., causing melting and reflowing to eliminate the voids, as schematically illustrated in FIG. 4. CMP is then conducted resulting in the structure illustrated in FIG. 5 wherein tungsten plug 50 does not exhibit voids.

Figure 6:
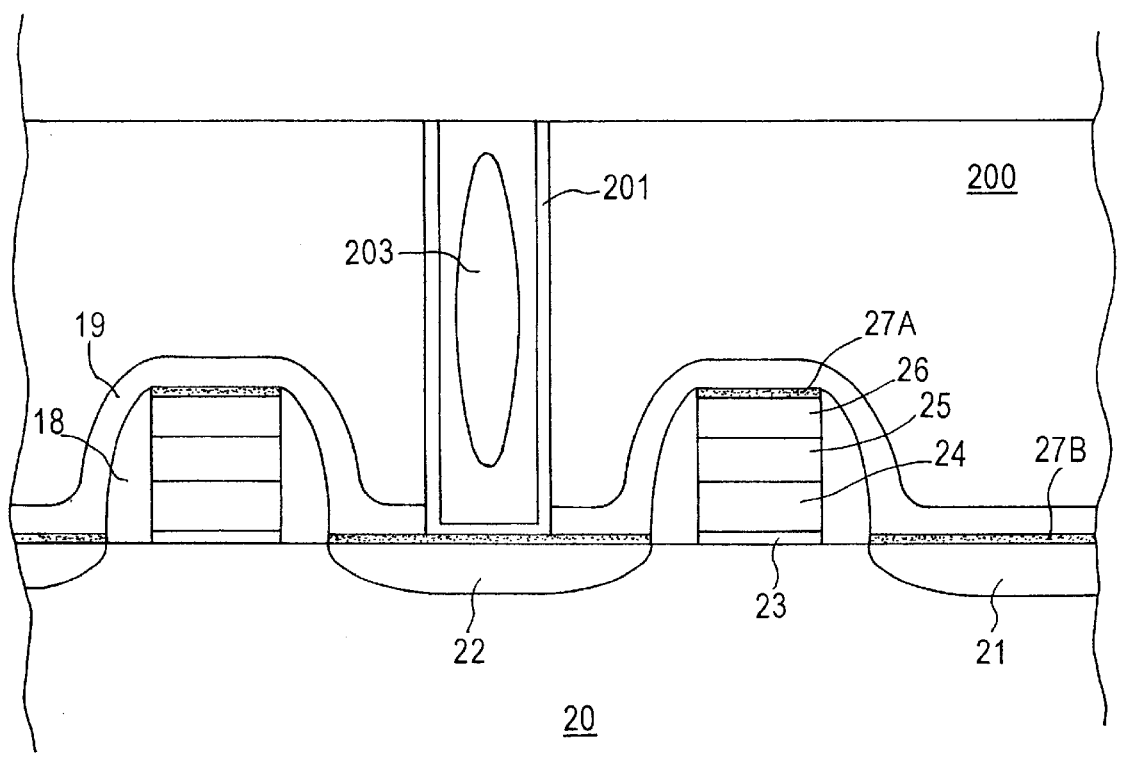
FIGS. 6 through 8 schematically illustrate sequential phases of a method in accordance with another embodiment of the present invention.
Figure 7:
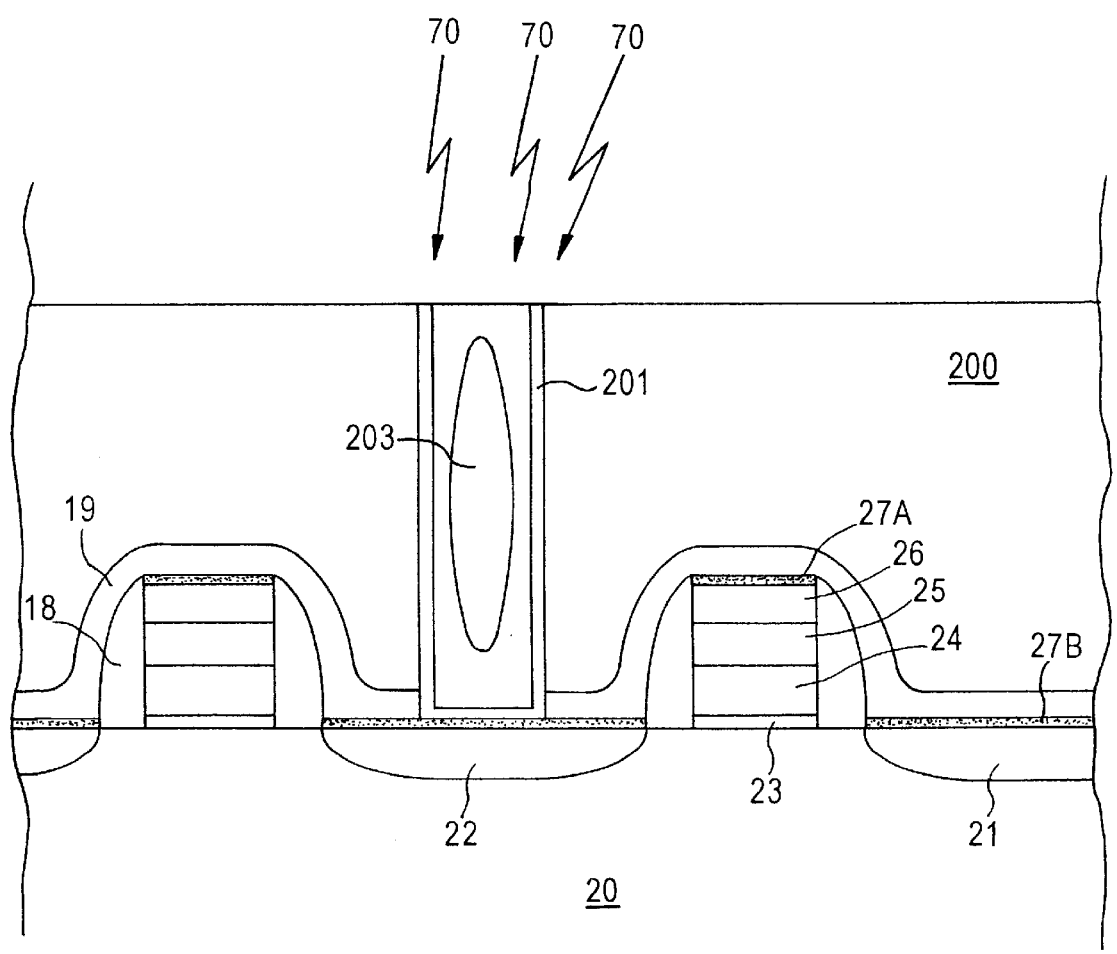
Figure 8:
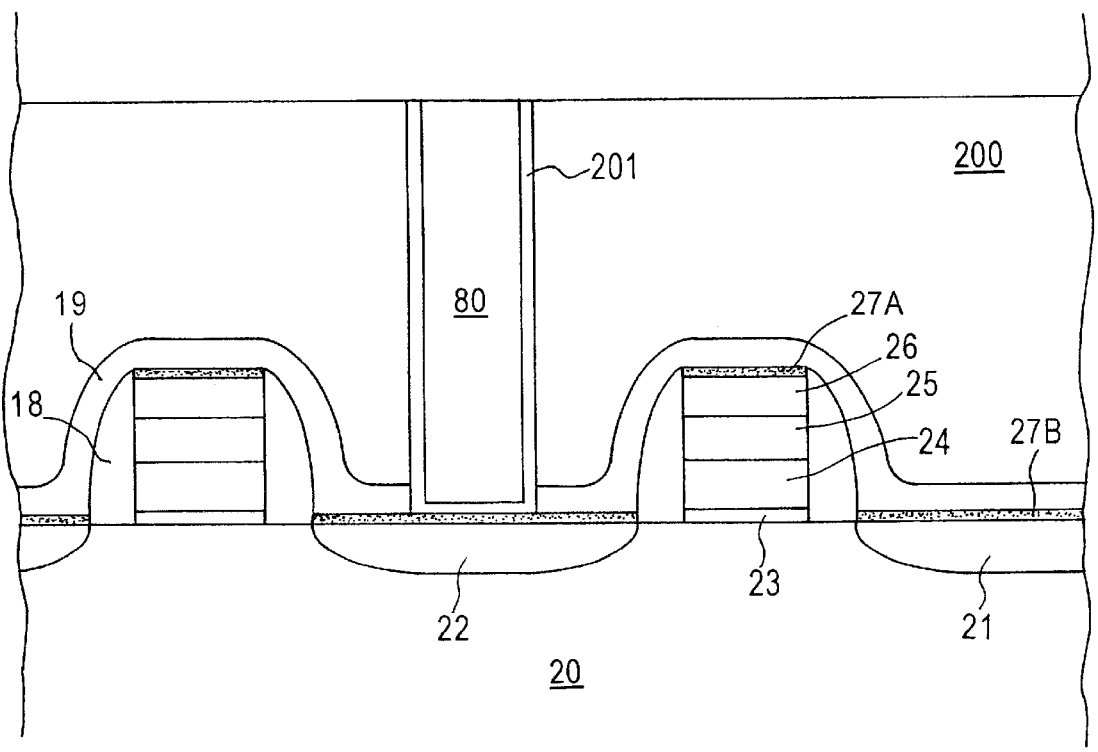

In accordance with another embodiment of the present invention, as schematically illustrated in FIGS. 6 through 8, CMP is conducted prior to laser thermal annealing. Adverting to FIG. 6, the depicted structure is that resulting from performing CMP on the structure schematically illustrated in FIG. 2. Laser thermal annealing is then conducted, as illustrated in FIG. 7, by impinging a pulsed laser light beam 70 directed at the W plug causing reflowing and void elimination. The resulting structure is schematically illustrated in FIG. 8 and comprises W plug 80 without voids.

The present invention, provides methodology enabling the formation of interconnects having W contacts and/or vias with large aspect ratios, e.g., 4 or greater, with no or significantly reduced voids, thereby reducing contact resistance and stabilizing contact resistance distribution to provide a tighter resistance distribution, improving device reliability and improving electromigration performance. The present invention enjoys industrial applicability in manufacturing any of various types of semiconductor devices with improved reliability and increased circuit speed. The present invention has particular applicability in manufacturing semiconductor devices with design features in the deep submicron regime, such as flash memory devices, e.g., EEPROMs, with a design rule of about 0.12 micron and under, with significantly improved reliability, increased circuit speed, improved electromigration performance and improved manufacturing throughput.

In the preceding detailed description, the present invention is described with reference to specific exemplary embodiments thereof. It will, however, be evident that various modifications and changes may be made thereto without departing from the broader scope of the present invention, as set forth in the claims. The specification and drawings are, accordingly, to be regarded as illustrative and not as restrictive. It is understood that the present invention is capable of use in various other combinations and environments and is capable of changes or modifications within the scope of the inventive concept as expressed herein.

What is claimed is:

1. A method of manufacturing a semiconductor device, the method comprising:

forming an opening in a dielectric layer;

depositing tungsten (W) into the opening; and laser thermal annealing the deposited W to melt and reflow the W in the opening.

2. The method according to claim 1, comprising laser thermal annealing by impinging a pulsed laser light beam on the deposited W filling the opening at a radiant fluence of about 0.78 to about 1.10 joules/cm$^2$.

3. The method according to claim 2, comprising laser thermal annealing to heat the deposited W filling the opening to a temperature of about 3,000° C. to about 3,600° C.

4. The method according to claim 1, comprising laser thermal annealing in nitrogen ($N_2$).

5. The method according to claim 4, comprising laser thermal annealing employing an $N_2$ flow rate of about 200 to about 2,000 sccm.

6. The method according to claim 1, comprising depositing a barrier layer lining the opening before depositing the W.

7. The method according to claim 6, wherein the barrier layer is a composite comprising a titanium layer on the dielectric layer an a titanium nitride layer on the titanium layer.

8. The method according to claim 1, comprising conducting chemical mechanical polishing (CMP) after laser thermal annealing such that an upper surface of the W in the opening is substantially co-planar with an upper surface of the dielectric layer.

9. The method according to claim 1, comprising conducting chemical mechanical polishing (CMP) before laser thermal annealing such that an upper surface of the W is substantially co-planar with an upper surface of the dielectric layer.

10. The method according to claim 4, comprising laser thermal annealing by impinging a pulsed laser light beam on the deposited W filling the opening at a radiant fluence of about 0.78 to about 1.10 joules/cm$^2$.

11. The method according to claim 10, comprising laser thermal annealing to heat the deposited W filling the opening to a temperature of about 3,000° C. to about 3,600° C., thereby reflowing the W in the opening.

12. The method according to claim 1, wherein the dielectric material comprises an oxide.

13. The method according to claim 12, wherein the dielectric material comprises a boron and/or a phosphorus doped silicate glass.

14. The method according to claim 1, comprising forming an opening to serve as a contact opening and filling the opening with W to form a contact.

15. The method according to claim 1, comprising forming a via opening and filling the opening with W to form a via.

16. The method according to claim 1, comprising forming an opening having an aspect ratio (depth/diameter) at least about 4:1.

* * * * *